United States Patent
Khoury et al.

(10) Patent No.: US 9,088,368 B2
(45) Date of Patent: Jul. 21, 2015

(54) METHODS AND DEVICES FOR ACTIVE OPTICAL CABLE CALIBRATION

(71) Applicant: Mellanox Technologies, Ltd., Yokneam (IL)

(72) Inventors: Ihab Khoury, Nazeret Elite (IL); Yossi Smeloy, Camon (IL)

(73) Assignee: Mellanox Technologies, Ltd., Yokneam (IL)

( * ) Notice: Subject to any disclaimer, the term of this patent is extended or adjusted under 35 U.S.C. 154(b) by 189 days.

(21) Appl. No.: 13/733,435

(22) Filed: Jan. 3, 2013

(65) Prior Publication Data

US 2014/0186029 A1 Jul. 3, 2014

(51) Int. Cl.
| | |
|---|---|
| H04B 10/073 | (2013.01) |
| H01S 5/042 | (2006.01) |
| H01S 5/183 | (2006.01) |
| H04B 10/50 | (2013.01) |
| H01S 5/00 | (2006.01) |

(52) U.S. Cl.
CPC ............ H04B 10/504 (2013.01); H04B 10/073 (2013.01); *H01S 5/0014* (2013.01); *H01S 5/042* (2013.01); *H01S 5/183* (2013.01)

(58) Field of Classification Search
CPC ..... H01S 5/423; H04B 10/073; H04B 10/504
USPC ............................................. 385/14; 375/371
See application file for complete search history.

(56) References Cited

U.S. PATENT DOCUMENTS

| | | | |
|---|---|---|---|
| 6,580,531 B1 | 6/2003 | Swanson et al. | |
| 7,058,299 B1 | 6/2006 | Shah et al. | |
| 7,280,768 B2 | 10/2007 | Zaacks et al. | |
| 7,313,333 B2 | 12/2007 | Lee et al. | |
| 7,522,835 B1 | 4/2009 | Guertin et al. | |
| 7,680,164 B1 * | 3/2010 | Draper et al. | 372/38.02 |
| 8,165,478 B2 | 4/2012 | Noda et al. | |
| 2003/0095737 A1 * | 5/2003 | Welch et al. | 385/14 |
| 2004/0057725 A1 | 3/2004 | Lee et al. | |
| 2005/0265717 A1 | 12/2005 | Zhou | |

(Continued)

OTHER PUBLICATIONS

Abarbanel et al., "Synchronization and Communication Using Semiconductor Lasers With Optoelectronic Feedback," IEEE Journal of Quantum Electronics, vol. 37, No. 10, Oct. 2001, pp. 1301-1311.

(Continued)

*Primary Examiner* — David Payne
*Assistant Examiner* — Omar S Ismail
(74) *Attorney, Agent, or Firm* — Finnegan, Henderson, Farabow, Garrett & Dunner, LLP

(57) ABSTRACT

Methods and devices for laser driver calibration are disclosed. The methods and devices disclose determining first and second bit error rates for use in calibrating the laser driver. The methods and devices also disclose that if the first bit error rate associated with a first initial value is above a predetermined bit error rate, increasing the first initial value until the first bit error rate is not above the predetermined bit error rate, and if the second bit error rate associated with a second initial value is above a predetermined bit error rate, decreasing the second initial value until the second bit error rate is not above the predetermined bit error rate. In addition, the methods and devices disclose setting a calibrated parameter for the laser driver based, at least in part, on the increased first initial value and the decreased second initial value.

21 Claims, 10 Drawing Sheets

(56) References Cited

U.S. PATENT DOCUMENTS

| | | |
|---|---|---|
| 2007/0122148 A1* | 5/2007 | Welch et al. .................... 398/27 |
| 2008/0175341 A1* | 7/2008 | Sato .............................. 375/371 |
| 2011/0123191 A1 | 5/2011 | Murakami et al. |
| 2012/0134665 A1 | 5/2012 | Lindsay |
| 2012/0148234 A1 | 6/2012 | Bellagamba et al. |
| 2012/0177367 A1* | 7/2012 | Miller ............................. 398/37 |
| 2012/0224849 A1* | 9/2012 | Rylyakov et al. .............. 398/27 |
| 2012/0251116 A1* | 10/2012 | Li et al. .......................... 398/79 |

OTHER PUBLICATIONS

Albeanu et al., "Optical Connector Contamination and Its Influence on Optical Signal Performance," created Sep. 2003.

Sun et al., "25 Gbps Transmission over Laser-Optimized Multimode Optical Fiber," created Aug. 2012.

\* cited by examiner

METHODS AND DEVICES FOR ACTIVE OPTICAL CABLE CALIBRATION

TECHNICAL FIELD

The present disclosure relates to the field of active optical cable calibration and, more particularly, methods, systems, and devices for calibrating a laser driver.

BACKGROUND

Optical fiber cables are used in a variety of fields, such as, for example, telecommunications and computer networking. Optical fiber cables often provide a number of benefits over electrical cables, such as, for example, higher bandwidth and reduced interference from external noise. To transmit data over an optical fiber cable between two electrical systems, an optical transceiver is often needed to connect each electrical system to the optical fiber cable. However, many computer systems do to include dedicated optical transceivers.

Active optical cables, which include built-in optical transceivers at both ends of the optical fiber cable, are often used instead of dedicated optical transceivers. Such active optical cables can be plugged into electrical components, such as, for example, network ports. In particular, active optical cables are often configured to have the same or similar physical dimensions to traditional electrical cables such that traditional electrical cables can be more easily replaced with active optical cables. Thus, active optical cables are often used to provide a user with an easy way to replace traditional electrical cables while gaining the benefits of optical fiber cables.

Often, a transmitter of an optical transceiver includes a laser, such as a vertical cavity surface-emitting laser ("VCSEL"), and a laser driver. A laser driver typically includes various configurable parameters that affect the current output from the laser driver into the laser. By adjusting the parameters of the laser driver, the performance of the active optical cable can likewise be adjusted. However, because an active optical cable typically includes various electrical, optical, electro-optical, and mechanical components, variability in the various components that make up an active optical cable often makes each active optical cable unique. Thus, for a group of active optical cables being manufactured, configuring all laser drivers to have the same parameter settings will often result in poor active optical cable performance. Thus, to achieve optimal data transmission with active optical cables, laser driver calibration often needs to be performed on an individual laser driver basis.

Existing techniques for calibrating laser drivers of active optical cables rely on assumptions that are often inaccurate and imprecise. For example, one technique for calibrating a laser driver is to input a signal into the laser driver and view the signal output from the laser driven by the laser driver on an oscilloscope. The parameters of the laser driver may then be adjusted until the signal displayed on the oscilloscope reaches predetermined characteristics. However, the relationship between the signal displayed on an oscilloscope and the performance of an active optical cable is often imprecise and inaccurate.

Improvements in active optical cable calibration technology, including technology that more precisely calibrates a laser driver of an active optical cable, are desirable.

SUMMARY

In one disclosed embodiment, a method for calibrating a laser driver is disclosed. The method comprises determining first and second bit error rates for use in calibrating the laser driver. In addition, the method comprises, if the first bit error rate associated with a first initial value is above a predetermined bit error rate, increasing the first initial value until the first bit error rate is not above the predetermined bit error rate. In addition, the method comprises, if the second bit error rate associated with a second initial value is above a predetermined bit error rate, decreasing the second initial value until the second bit error rate is not above the predetermined bit error rate. In addition, the method comprises setting a calibrated parameter for the laser driver based, at least in part, on the increased first initial value and the decreased second initial value.

In another disclosed embodiment, a laser driver is disclosed. The laser driver is calibrated by determining first and second bit error rates for use in calibrating the laser driver, if the first bit error rate associated with a first initial value is above a predetermined bit error rate, increasing the first initial value until the first bit error rate is not above the predetermined bit error rate, if the second bit error rate associated with a second initial value is above a predetermined bit error rate, decreasing the second initial value until the second bit error rate is not above the predetermined bit error rate, and setting a calibrated parameter for the laser driver based, at least in part, on the increased first initial value and the decreased second initial value.

Additional aspects related to the embodiments will be set forth in part in the description which follows, and in part will be obvious from the description, or may be learned by practice of the invention.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Active optical cable calibration can he improved by implementing bit error rate analysis techniques. In some disclosed embodiments, an average current, a modulation current, and a pre-emphasis current for an output of a laser driver are calibrated. In some disclosed embodiments, the average current is set based on an intended lifetime for a laser driven by the laser driver. In addition, in some disclosed embodiments, the modulation current and/or the pre-emphasis current are set based on a bit error rate analysis.

In some disclosed embodiments, the bit error rate analysis includes setting an initial minimum value for a parameter of the laser driver, measuring a bit error rate, and if the measured bit error rate is above a predetermined bit error rate, increasing the minimum value for the parameter until the bit error rate is not above the predetermined bit error rate. In addition, in some disclosed embodiments, the bit error rate analysis includes setting an initial maximum value for the parameter of the laser driver, measuring a bit error rate, and if the measured bit error rate is above a predetermined bit error rate, decreasing the maximum value for the parameter until the bit error rate is not above the predetermined bit error rate. In some disclosed embodiments, the bit error rate analysis includes setting the parameter of the laser driver based, at least in part, on the increased minimum value and the decreased maximum value. In embodiments in which the parameter of the laser driver that is set based on a bit error rate analysis is the pre-emphasis current, the initial minimum value may be selected based on a bandwidth limit for the active optical cable and the initial maximum value may be selected based on a jitter limit for the active optical cable.

Figure 1:
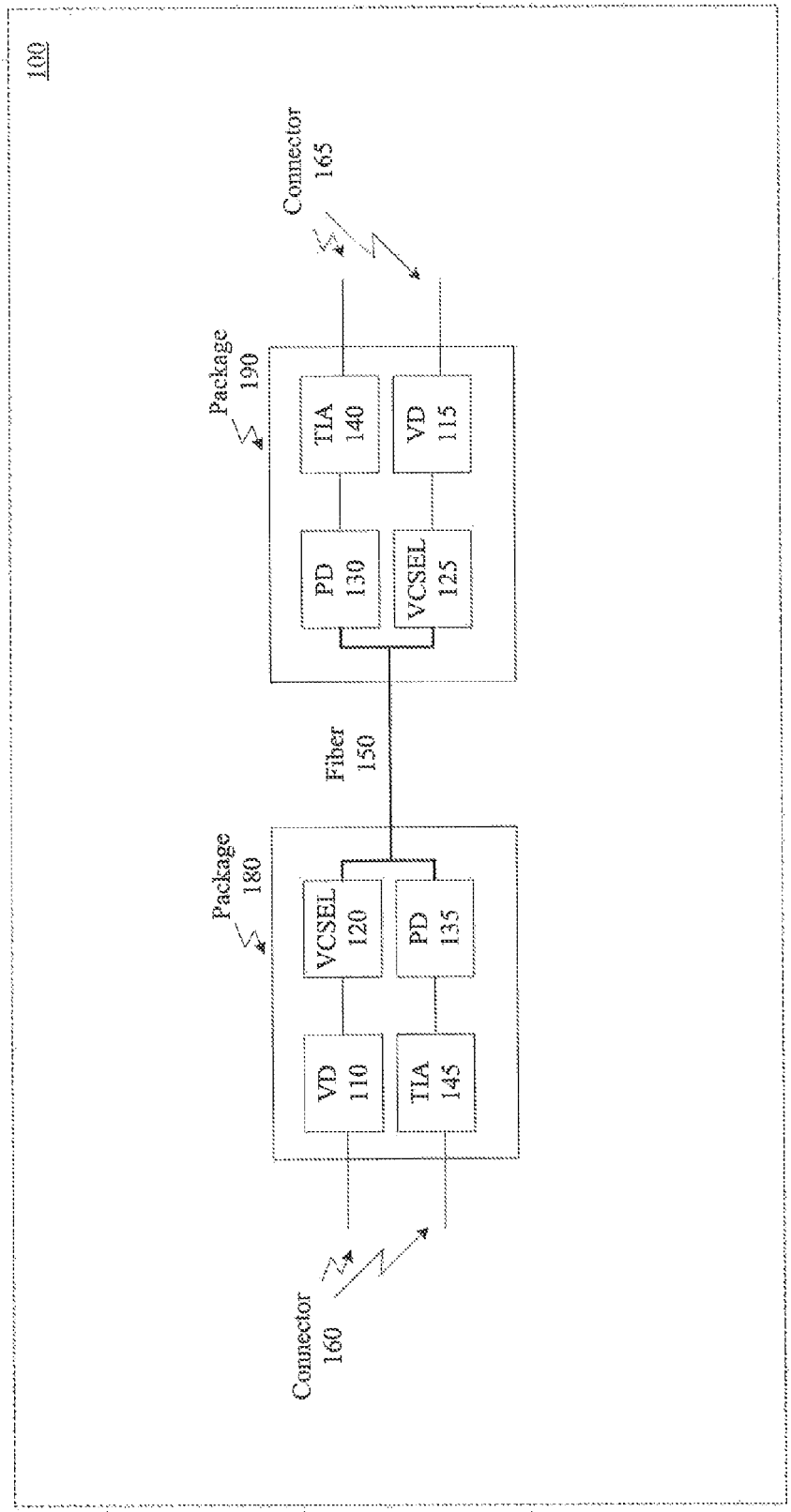
FIG. 1 illustrates an example active optical cable that may be used for implementing the disclosed embodiments.

FIG. 1 is a diagram illustrating an example active optical cable 100 according to some disclosed embodiments. Active optical cable 100 may include a package 180 and a package 190 connected by one or more optical fiber cables 150. In some embodiments, package 180 includes a connector 160. Connector 160 may be configured, for example, to connect to a network port such as an Ethernet, InfiniBand, or Peripheral Component Interconnect Express port. Connector 160 may also be configured, for example, to connect to electrical components that transmit and/or receive electrical data other than network ports. In some embodiments, connector 160 includes a number of lines for transmitting and/or receiving data. For example, as depicted in FIG. 1, connector 160 may comprise two lines, with one line for transmitting data and one line for receiving data. In alternative embodiments, connector 160 may include more than one line for transmitting data, more than one line for receiving data, no lines for transmitting data, and/or no lines for receiving data. In some embodiments, package 190 includes a connector 165 configured in substantially the same manner as connector 160.

In some embodiments, package 180 and package 190 have a pluggable form factor. For example, package 180 and package 190 may be Quad Small Form-factor Pluggable ("QSFP") transceivers, enhanced Quad Small Form-factor Pluggable ("QSFP+") transceivers, Small Form-factor Pluggable ("SFP") transceivers, or enhanced Small Form-factor Pluggable ("SFP+") transceivers.

In some embodiments, one line of connector 160 connects, directly or indirectly, to a vertical cavity surface-emitting laser ("VCSEL") driver 110. VCSEL driver 110 may control the current supplied to a VCSEL 120 to which VCSEL driver 110 is connected, directly or indirectly. VCSEL driver 110 may be constructed as a circuit such as, for example, an integrated circuit. In alternative embodiments, a different type of laser may replace VCSEL 120. In some embodiments, one or more parameters of the VCSEL driver 110 are settable. For example, the average current output from the VCSEL driver 110 may be set. In addition, the modulation current output from the VCSEL driver 110, representative of the difference between the peak and trough of the signal output from the VCSEL driver 110, may also be set. Moreover, for example, the pre-emphasis current supplied by the VCSEL driver 110, which may adjust the shape of the signal output from the VCSEL driver 110, may also be set. In alternative embodiments, additional or alternative parameters of the VCSEL driver 110 may also be set. The parameters of the VCSEL driver 110 may be set in a number of ways such as, for example, using a controller.

In some embodiments, VCSEL driver 110 is capable of encoding the signal supplied from connector 160 onto the current supplied to VCSEL 120. For example, in some embodiments, the signal supplied from connector 160 may be encoded using frequency modulation, amplitude modulation, or phase modulation. Based on the amount of current supplied to VCSEL 120, VCSEL 120 may emit a laser output with a laser intensity that corresponds to the current supplied by the VCSEL driver 110. Thus, the data encoded onto the current supplied by the VCSEL driver 110 may also be encoded on the laser emitted by VCSEL 120. The laser emitted by VCSEL 120 may propagate, either directly or indirectly via one or more components (e.g., lenses), into a fiber optic cable 150.

In some embodiments, the light emitted by VCSEL 120 is received by a photo-detector 130 in package 190. Photo-detector 130 may convert the received light into a corresponding amount of electrical current. In some embodiments, the current output by the photo-detector 130 is then be converted to a voltage by a transimpedance amplifier 140 to which the photo-detector 130 is connected, directly or indirectly, and output using connector 165.

As depicted in FIG. 1, in some embodiments package 190 also includes a VCSEL driver 115 and a VCSEL 125, configured in substantially the same manner as VCSEL driver 110 and VCSEL 120. Moreover, in some embodiments, package 180 also includes a photo-detector 135 and transimpedance amplifier 145, configured in substantially the same manner as photo-detector 130 and transimpedance amplifier 140. Thus, in such embodiments, data can travel in both directions of active optical cable 100. In some embodiments, fiber optic cable 150 is a multimode cable capable of carrying a plurality of frequencies of light. In such embodiments, a single multimode cable may be used to transmit data in both directions of the active optical cable. However, in alternative embodiments, single-mode cables are used for each transmission line.

While FIG. 1 depicts optical transceivers installed in package 180 and package 190 as part of an active optical cable 100, in some embodiments an optical transceiver comprising, for example, a laser driver, a laser, a photo-detector, and a transimpedance amplifier, is installed in an optical module that is not part of an active optical cable. For example, an optical transceiver may he installed in an optical engine such as, for example, Mid Board Optics.

Figure 2:
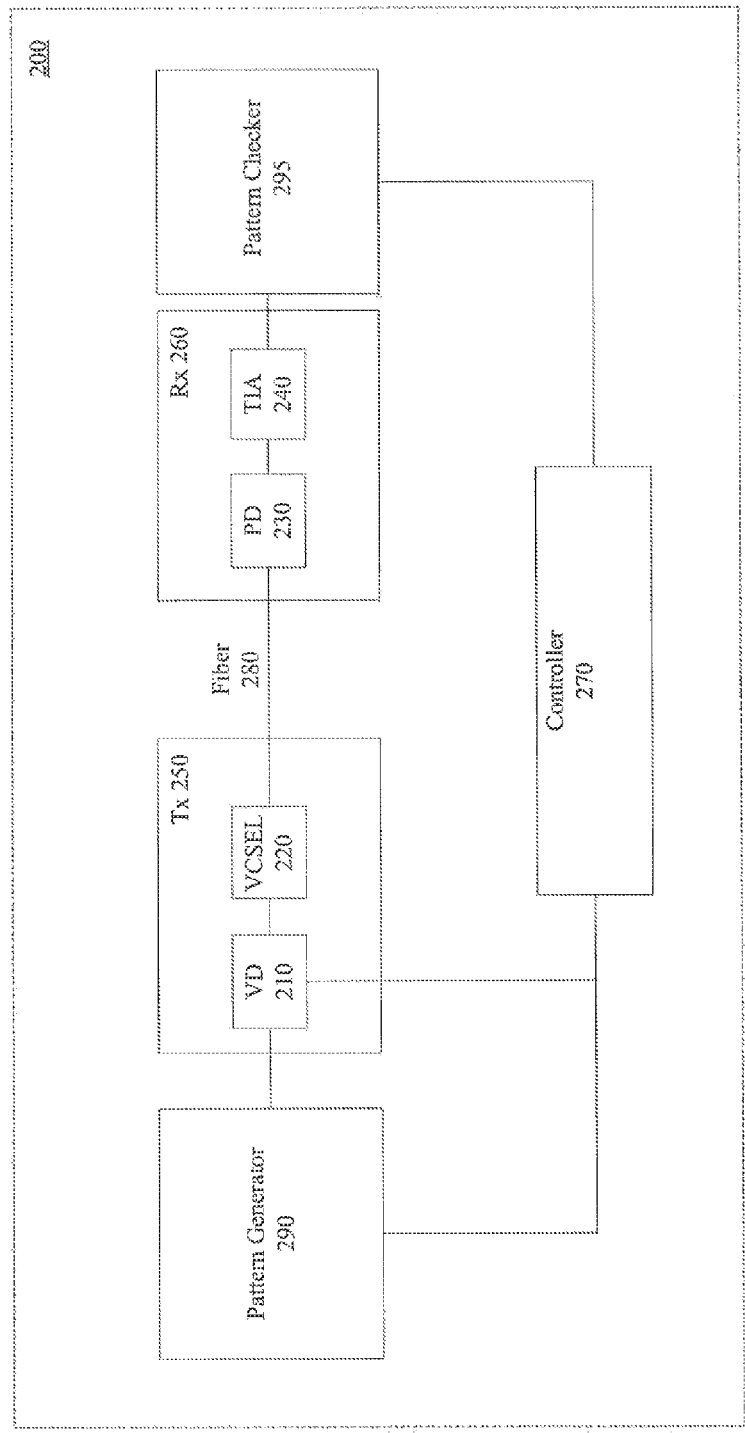
FIG. 2 illustrates an example system that may be used for implementing the disclosed embodiments.

FIG. 2 is a diagram illustrating an example system 200 that may be used for implementing the disclosed embodiments. In some embodiments, system 200 may be used for calibrating a VCSEL driver 210 of an active optical cable, such as, for example, active optical cable 100. System 200 may include a transmitter 250 comprising a VCSEL driver 210 and a VCSEL 220. In some embodiments, VCSEL driver 210 and VCSEL 220 are configured in substantially the same manner as described above with respect to VCSEL driver 110 and VCSEL 120. System 200 may also include a receiver 260, connected to transmitter 250 by an optical fiber cable 280, comprising a photo-detector 230 and a transimpedance amplifier 240. Photo-detector 230, transimpedance amplifier 240, and optical fiber cable 280 may be configured in substantially the same manner as photo-detector 130, transimpedance amplifier 140, and optical fiber cable 280, respectively. In some embodiments, transmitter 250 and receiver 260 may be part of an active optical cable, such as active optical cable 100. For example, VCSEL driver 210 and VCSEL 220 may be VCSEL driver 110 and VCSEL 120 within package 180, optical fiber cable 280 may be optical fiber cable 150, and photo-detector 230 and transimpedance amplifier 240 may be photo-detector 130 and transimpedance amplifier 140 within package 190. Thus, in some embodiments, active optical cable 100 may be included in system 200. However, in other embodiments, receiver 260 may be a reference receiver that will not be installed in an active optical cable. For example, in some embodiments, system 200 may be used to test a VCSEL driver 210 and VCSEL 220 that are being installed into an active optical cable against a reference receiver. Moreover, in some embodiments, VCSEL driver 210 and VCSEL 220 are tested for use in a laser module rather than an active optical cable. In addition, in some embodiments, a type of laser other than VCSEL 220 is used in place of VCSEL 220.

System 200 may also include a controller 270. Controller 270 may be a CPU or some other processor capable of electronically controlling the components of system 200. In some embodiments, controller 270 may be configured to calibrate the settable parameters of VCSEL driver 210 such as, for example, the average current, the modulation current, and the pre-emphasis current output by the VCSEL driver 210.

In some embodiments, system 200 also includes a pattern generator 290. In some embodiments, pattern generator 290 is configured to transmit a signal with a pattern to VCSEL driver 210. For example, pattern generator 290 may be configured to transmit one or more different pseudo-random bit sequences. In some embodiments, controller 270 is configured to select the pseudo-random bit sequence emitted by the pattern generator 290. The pattern output by pattern generator 290 may be encoded onto the current that is output by VCSEL driver 210 and, as a result, encoded onto the laser output by VCSEL 220. In some embodiments, system 200 also includes a pattern checker 295. Pattern checker may be configured to determine the bit error rate of the signal received by the receiver 260. For example, pattern checker 295 may be configured to compare the signal received at pattern checker 295 to the signal transmitted by pattern generator 290 to determine the number of errors in the received signal. In some embodiments, the controller 270 signals the type of pattern transmitted by pattern generator 290 to the pattern checker 295 for comparison. In alternative embodiments, pattern generator 290 and pattern checker 295 may be the same component.

Figure 3:
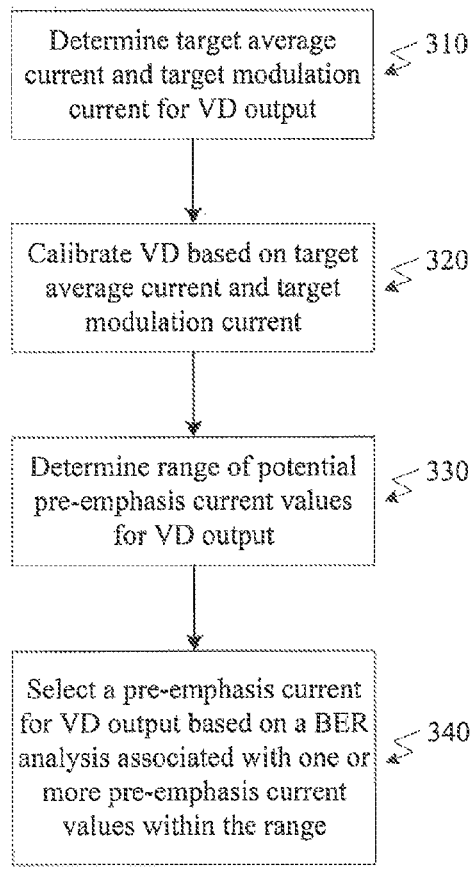
FIG. 3 illustrates an example method for selecting a pre-emphasis current for a VCSEL driver based on a bit error rate technique.

FIG. 3 is a diagram illustrating an example method 300 for selecting a pre-emphasis current for a VCSEL driver 210 based on a bit error rate analysis. In some embodiments, method 300 begins by determining a target average current and target modulation current for the output of the VCSEL driver 210. In some embodiments, the average current is determined based on an intended lifetime for a VCSEL 220 driven by the VCSEL driver 210.

Figure 5:
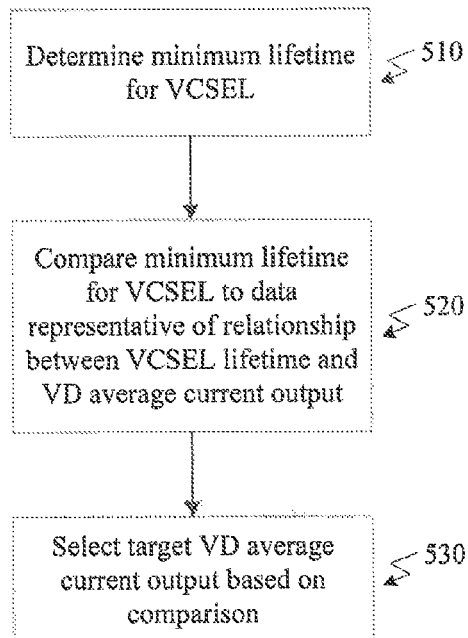
FIG. 5 illustrates an example method for selecting an average current for a VCSEL driver.

For example, as depicted in FIG. 5, a minimum lifetime for the VCSEL 220 may first be determined (step 510). For example, it may be determined that a minimum VCSEL lifetime of 2 years, 5 years, or 10 years is required. As the average current supplied to the VCSEL 220 increases, the VCSEL lifetime decreases. The relationship between the average current output by a VCSEL driver 210 and VCSEL lifetime may be stored in data. Thus, in some embodiments, the minimum VCSEL lifetime may be compared to the data representative of the relationship between VCSEL lifetime and average current output of a VCSEL driver 210 (step 520). In some embodiments, the data that is compared to indicates a current value for each VCSEL lifetime value in a set of VCSEL lifetime values such that, if the average current is set at or below the current value amount, the desired VCSEL lifetime will be achieved. The target average current for the output of the VCSEL driver 210 may then be selected based on the comparison (step 530). For example, if only VCSEL lifetime is considered, the average current may be set at or below the current value amount that achieves the desired VCSEL lifetime.

In some embodiments, factors other than VCSEL lifetime are considered when selecting a target average current output for the VCSEL driver 210. For example, in some embodiments, bandwidth is maximized for a given intended VCSEL lifetime. Since bandwidth increases as average current output by the VCSEL driver 210 increases, in embodiments in which a target VCSEL lifetime needs to be met and bandwidth needs to be maximized for the target VCSEL lifetime, the maximum average current output that still achieves the target VCSEL lifetime is selected as the target average current. In some embodiments, a margin of error is maintained such that the target average current output is set just below the maximum average current output that still achieves the target VCSEL lifetime to increase the likelihood of the target VCSEL lifetime being achieved.

In some embodiments, the target modulation current for the output of the VCSEL driver 210 may be set as the modulation current that achieves the minimum required extension ratio. In such embodiments, after determining the target average current and target modulation current, the VCSEL driver 210 may be calibrated to achieve the target average current and target modulation current (step 320). The VCSEL driver 210 may be calibrated by setting the VCSEL driver 210 to utilize various average and modulation currents and measuring corresponding current consumptions from the VCSEL driver's current source. Based on the current consumptions at various average and modulation currents, the relationship between the set average and modulation current of the VCSEL driver 210 and the actual output average and modulation current of the VCSEL driver 210 may be determined. For example, the average current source of the VCSEL driver 210 may be set to 0.1 mA and the current consumed by the VCSEL driver 210 may be measured. Then, the average current source may be set to 10.1 mA and the current consumed by the VCSEL driver 210 may be measured. The difference between the measured current consumed by the VCSEL driver 210 for the two current source values may be interpreted as the actual output average current of the VCSEL driver 210 when the average current of the VCSEL driver 210 is set to 10 mA.

In some embodiments, an initial range of potential pre-emphasis current values for the output of the VCSEL driver is then determined (step 330). For example, if the pre-emphasis current value is set too low, bandwidth may be too low for the requirements of the active optical cable. However, if the pre-emphasis current value is set too high, jitter may be too high for the requirements of the active optical cable. Thus, based on the maximum allowable jitter and the minimum allowable bandwidth, an initial range of acceptable potential pre emphasis current values is determined.

After determining the range of acceptable potential pre-emphasis current values, a pre-emphasis current for the output of the VCSEL driver 210 may be selected based on a bit error rate analysis (step 340). For example, as described in more detail below, the bit error rate resulting from setting the VCSEL driver 210 with each of a set of pre-emphasis current values may be determined and analyzed to select a pre-emphasis current for the VCSEL driver 210.

While FIG. 3 depicts the pre-emphasis current being selected based on a bit error rate analysis, different parameters of the VCSEL driver 210 may also be selected based on a bit error rate analysis in substantially the same manner. For example, a target pre-emphasis current may be selected without a bit error rate analysis and a modulation current for the VCSEL driver 210 may be selected based on a bit error rate analysis.

Figure 4:
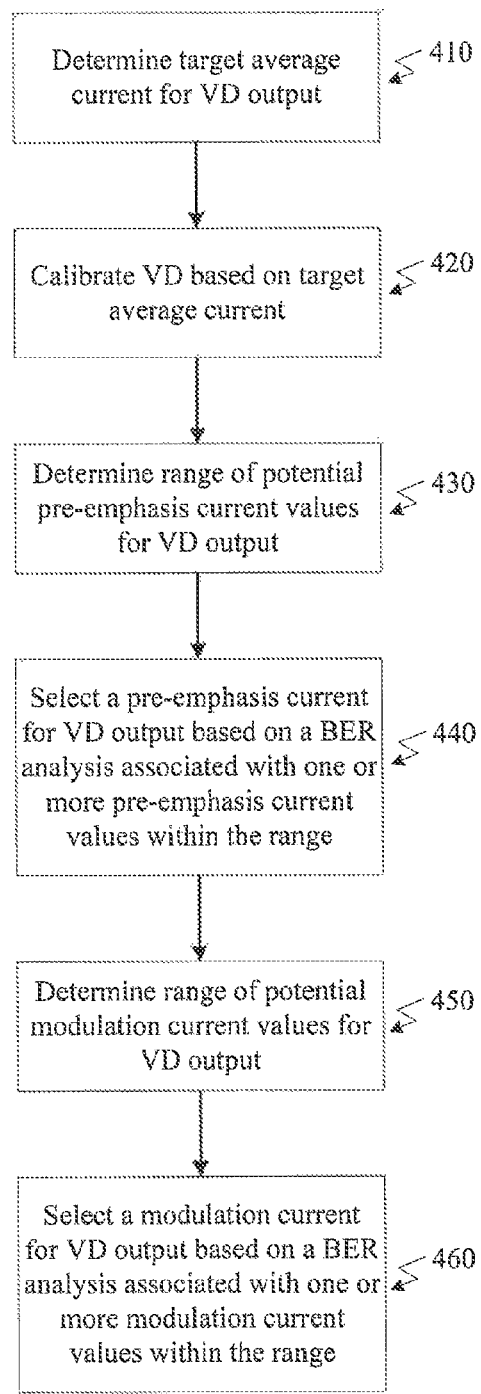
FIG. 4 illustrates an example method for selecting a pre-emphasis current and a modulation current for a VCSEL driver based on a bit error rate technique.

FIG. 4 is a diagram illustrating an example method 400 for selecting a pre-emphasis current and a modulation current for a VCSEL driver 210 based on a bit error rate analysis. In some embodiments, method 400 begins by determining a target average current for the VCSEL driver 210 (step 410), in substantially the same manner as the target average current is determined in step 310 of method 300. In addition, in some embodiments the VCSEL driver 210 is calibrated based on the target average current (step 420), in substantially the same manner as the calibration is performed step 320 of method 300. After calibrating the average current of the VCSEL driver 210, in some embodiments an initial range of potential pre-emphasis current values is determined (step 430), in substantially the same manner as the range is determined in step 330 of method 300. Moreover, a pre-emphasis current value may be selected for the VCSEL driver 210 using a bit error rate analysis (step 440), in substantially the same manner as the pre-emphasis current value is selected in step 340 of method 300.

In some embodiments, an initial range of acceptable modulation current values is then determined (step 450). For example, one or more modulation current values between a minimum required extension ratio and a maximum acceptable extension ratio may be included in the initial range of acceptable modulation current values. Then, in some embodiments, a modulation current for the VCSEL driver 210 may be selected based on a bit error rate analysis (step 460). In some embodiments, the bit error rate analysis of step 460 may be performed in substantially the same manner as the bit error rate analysis of step 440. Thus, in some embodiments, rather than determining a target modulation current without a bit error rate analysis (e.g., as described above with respect to steps 310 and 320 of method 300), the modulation current for the VCSEL driver 210 is selected based on a bit error rate analysis. For example, as described in more detail below, the bit error rate resulting from setting the VCSEL driver 210 with each of a set of modulation current values may be determined and analyzed to select a modulation current for the VCSEL driver 210.

While FIG. 4 depicts the pre-emphasis current as being selected (steps 430 and 440) before the modulation current is selected (steps 450 and 460), in alternative embodiments the modulation current may be selected (steps 450 and 460) before the pre-emphasis current is selected (steps 430 and 440). Moreover, in some embodiments, other parameters of the VCSEL driver 210 are also configured using non-bit error rate and/or bit error rate analysis.

Figure 6:
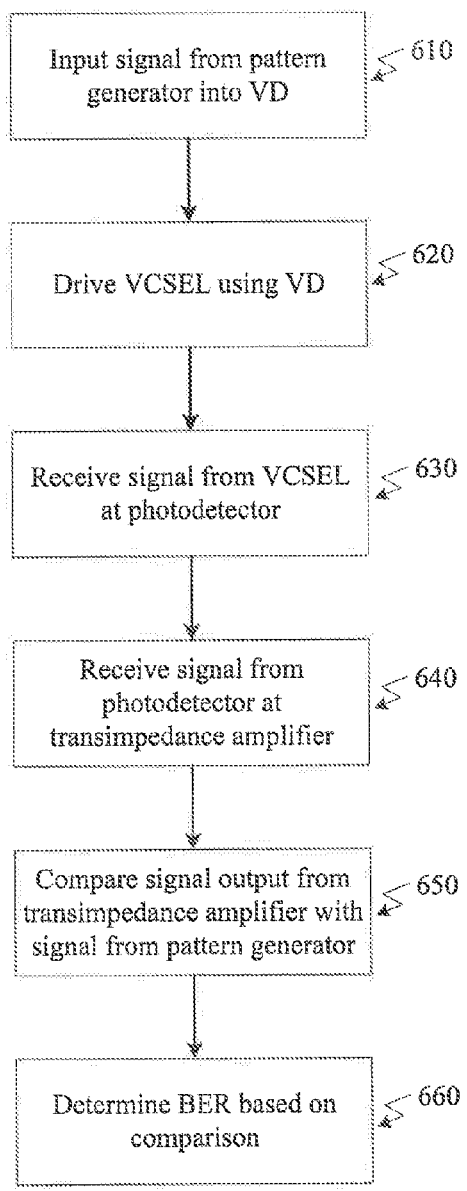
FIG. 6 illustrates an example method for determining a bit error rate.

FIG. 6 is a diagram illustrating an example method 600 for determining a bit error rate associated with an active optical cable transmitter. In some embodiments, method 600 begins with a signal from a pattern generator 290 being input into a VCSEL driver 210 (step 610). As described above, in some embodiments the signal from pattern generator 290 is a pseudo-random bit sequence. In some embodiments, current encoded with the pseudo-random bit sequence is output from VCSEL driver 210 to VCSEL 220 (step 620). In some embodiments, VCSEL 220 emits a laser, with an intensity based on the received current at the VCSEL 220, which propagates through a fiber optical cable 280 and is received at a photo-detector 230 (step 630). In some embodiments, a transimpedance amplifier 240 receives current output by photo-detector 230 and outputs a voltage corresponding to the received current (step 640). The signal output by the transimpedance amplifier to a pattern checker 295 may then be compared to the signal output by pattern generator 290 (step 650). For example, both the signal output by the transimpedance amplifier and the signal output by pattern generator 290 may be converted to binary data and the number of differences and matches between the binary data may be determined. Based on the comparison between the signal output by pattern generator 290 and the signal received by pattern checker 295, the bit error rate may be determined (step 660). For example, the bit error rate may be set as the number of differences divided by a combination of the number of difference and number of matches.

Figure 7:
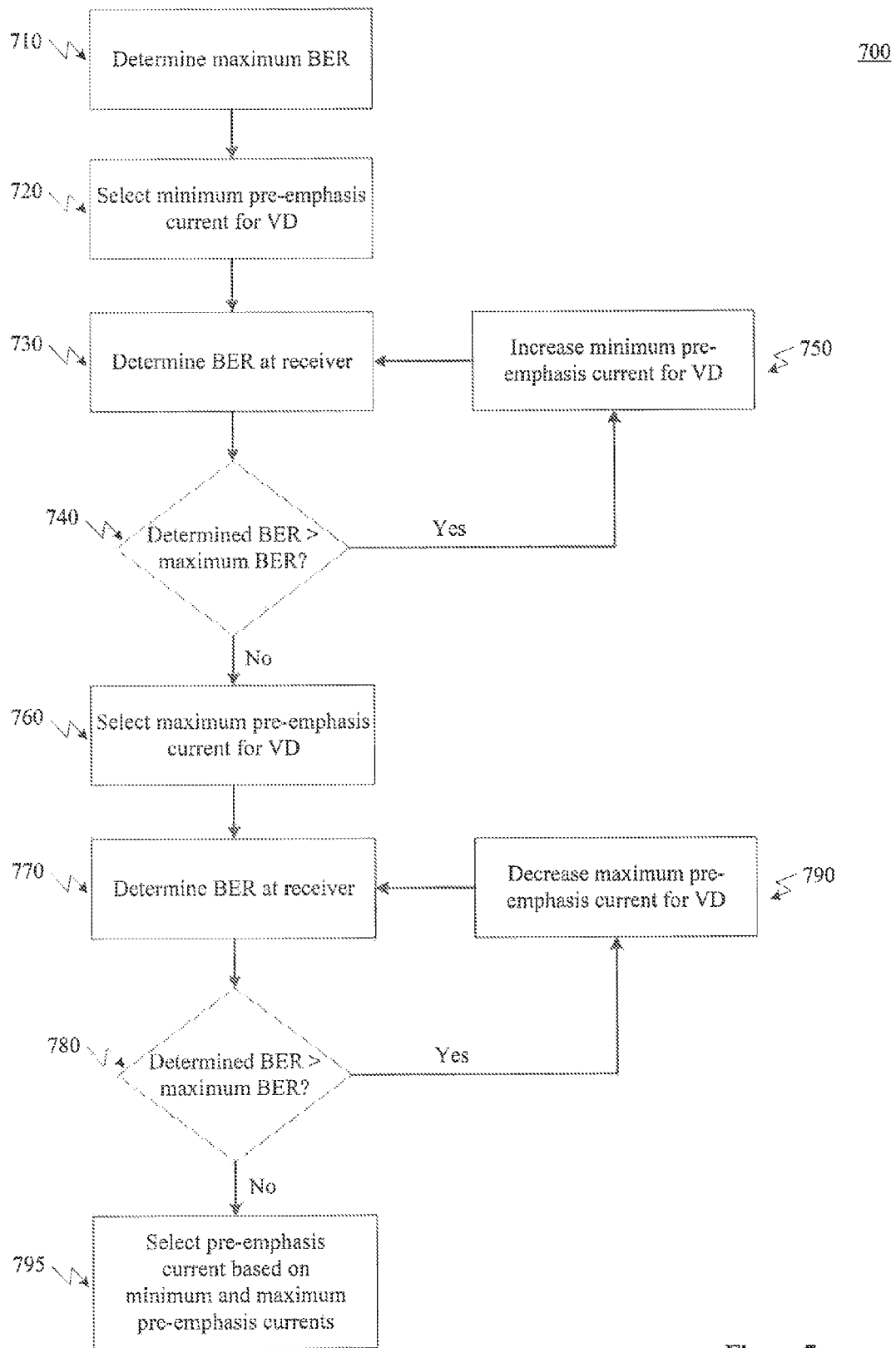
FIG. 7 illustrates an example method for selecting a pre-emphasis current for a VCSEL driver based on a bit error rate technique.
Figure 10:
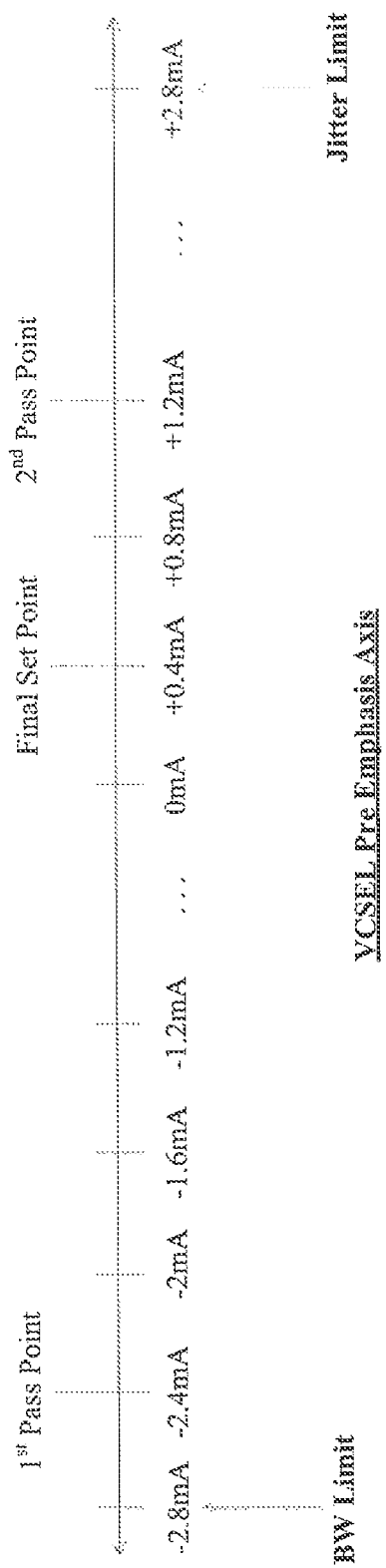
FIG. 10 illustrates an example plot of data from a pre-emphasis current selection process.

FIG. 7 is a diagram illustrating an example method 700 for selecting a pre-emphasis current for a VCSEL driver 210 based on a bit error rate analysis. In some embodiments, method 700 begins with a determination of the maximum acceptable bit error rate (step 710). For example, some active optical cables may have a relatively high maximum acceptable bit error rate, while other active optical cables may have a relatively low maximum acceptable bit error rate. Then, an initial minimum pre-emphasis current for the VCSEL driver 210 may be selected (step 720). For example, as depicted in the example of FIG. 10, if the pre-emphasis current is set too low, the bandwidth of an active optical cable may go below a bandwidth limit. Thus, in some embodiments, the initial minimum pre-emphasis current is set at or above a pre-emphasis current that achieves the bandwidth limit. Thus, in the example depicted in FIG. 10, the initial minimum pre-emphasis current may be set at −2.8 mA, which is representative of the pre-emphasis current that results in a minimum acceptable bandwidth. A controller, such as, for example, controller 270, may be used to configure VCSEL driver 210 to utilize the initial minimum pre-emphasis current.

In some embodiments, a bit error rate associated with the VCSEL driver 210 is then measured using a process, for example, as described above with respect to method 600 (step 730). A determination may then be made as to whether the determined bit error rate is above the maximum acceptable bit error rate (step 740). If the determined bit error rate is above the maximum acceptable bit error, the pre-emphasis current of the VCSEL driver 210 may then be increased (step 750). In some embodiments, the pre-emphasis current may be increased by a predetermined amount (e.g., each time the pre-emphasis current is increased, it may always be increased by the same amount, such as, for example, 0.4 mA). In other embodiments, the pre-emphasis current may be increased by an amount based on the determined bit-error rate (e.g., the pre-emphasis current may be increased a relatively large amount if the difference between the determined bit error rate and the maximum acceptable bit error is relatively large, whereas the pre-emphasis current may be increased a relatively small amount if the difference between the determined bit error rate and the maximum acceptable bit error rate is relatively small). In some embodiments, steps 730-750 may be repeated until the determined bit error rate is at or below the maximum acceptable bit error rate. In the example depicted in FIG. 10, the pre-emphasis current may be increased by 0.4 mA with each repetition of steps 730-750. The first pre-emphasis current that results in a bit error rate below the maximum acceptable bit error rate may be kept as a first pass point. In the example of FIG. 10, a pre-emphasis current of −2.4 mA results in a bit error rate below the maximum acceptable bit error rate and is kept as a first pass point. In some embodiments, if no pre-emphasis current is found that results in a bit error rate below the maximum acceptable bit error rate, the maximum acceptable bit error rate is decreased.

In some embodiments, an initial maximum pre-emphasis current for the VCSEL driver 210 may be selected (step 760). For example, as depicted in FIG. 10, if the pre-emphasis current is too high, the jitter of an active optical cable may go above a jitter limit. Thus, the initial maximum pre-emphasis current may be set at or below a pre-emphasis current that achieves the jitter limit. Thus, as depicted in the example of FIG. 10, the initial maximum pre-emphasis current may be set at 2.8 mA, which is representative of the pre-emphasis current that results in a maximum acceptable jitter. While in the example of FIG. 10, the jitter limit and the bandwidth limit are opposite values (i.e., the jitter limit is 2.8 mA and the bandwidth limit is −2.8 mA), the initial minimum pre-emphasis current and the initial maximum pre-emphasis current are not necessarily opposites. A controller, such as, for example, controller 270, may be used to configure VCSEL driver 210 to utilize the initial maximum pre-emphasis current.

In some embodiments, a bit error rate associated with the VCSEL driver 210 is then measured using a process, for example, as described above with respect to method 600 (step 770). A determination may then be made as to whether the determined bit error rate is above the maximum acceptable bit error rate (step 780). If the determined bit error rate is above the maximum acceptable bit error, the pre-emphasis current of the VCSEL driver 210 may then be decreased (step 790). In some embodiments, the pre-emphasis current may be decreased by a predetermined amount (e.g., each time the pre-emphasis current is decreased, it may always be decreased by the same amount, such as, for example, 0.4 mA). In other embodiments, the pre-emphasis current may be decreased by an amount based on the determined bit-error rate (e.g., the pre-emphasis current may be decreased a relatively large amount if the difference between the determined bit error rate and the maximum acceptable bit error is relatively large, whereas the pre-emphasis current may be decreased a relatively small amount if the difference between the determined bit error rate and the maximum acceptable bit error rate is relatively small). In some embodiments, steps 770-790 may be repeated until the determined bit error rate is at or below the maximum acceptable bit error rate. In the example depicted in FIG. 10, the pre-emphasis current may be decreased by 0.4 mA with each repetition of steps 770-790. The first pre-emphasis current that results in a bit error rate below the maximum acceptable bit error rate may be kept as a second pass point. In the example of FIG. 10, a pre-emphasis current of 1.2 mA results in a bit error rate below the maximum acceptable bit error rate and is kept as a second pass point.

In some embodiments, the pre-emphasis current for the VCSEL driver 210 may then be set as a value selected at or between the first pass point and the second pass point (step 795). For example, in the example depicted in FIG. 10, a pre-emphasis current of 0.4 mA is selected for the VCSEL driver 210. In some embodiments, the pre-emphasis current of the VCSEL driver 210 is permanently set as the selected value. For example, in some embodiments, after the parameters of VCSEL driver 210 are set, the VCSEL driver 210 and VCSEL 220 may be permanently installed in an active optical cable 100 in such a manner that the parameters of VCSEL driver 210 cannot be changed. In other embodiments, the pre-emphasis current is periodically tuned. For example, in some embodiments, the parameters of VCSEL driver 210 may be changed while VCSEL driver 210 and VCSEL 220 are installed in an active optical cable 100. In embodiments in which the parameters of VCSEL driver 210 may be changed while VCSEL driver 210 and VCSEL 220 are installed in an active optical cable 100, the method 700 may be repeated in response to an event such as, for example, a change in the average current output by the VCSEL driver 210, a determination that the bit error rate of the active optical cable 100 has increased above the maximum acceptable bit error rate, and/or a determination that the intended lifetime of the VCSEL 220 has changed.

Figure 8:
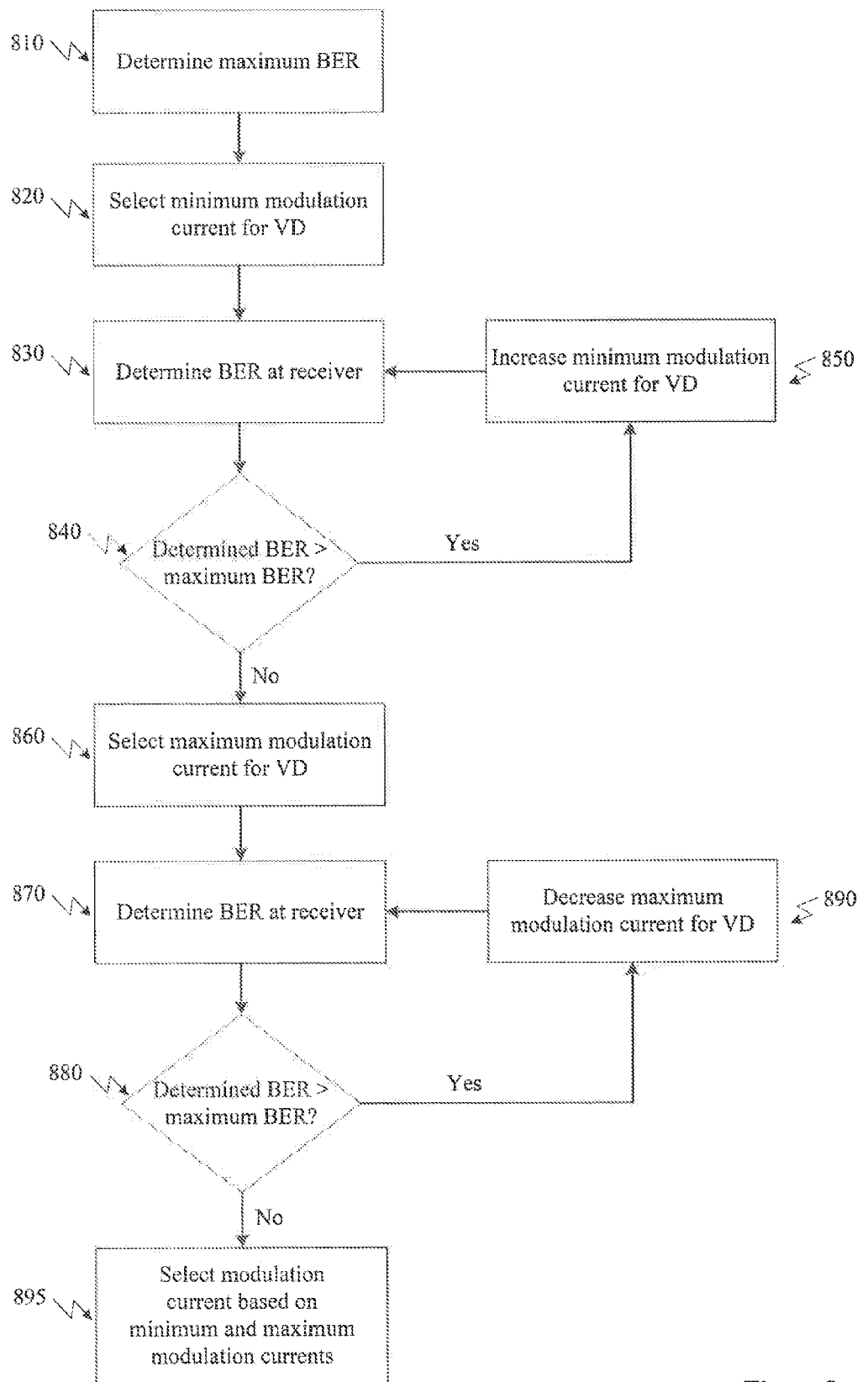
FIG. 8 illustrates an example method for selecting a modulation current for a VCSEL driver based on a bit error rate technique.

While FIG. 7 depicts a method for selecting a pre-emphasis current for a VCSEL driver 210, other parameters of the VCSEL driver 210 may also be selected using a substantially similar process. For example, FIG. 8 illustrates an example method 800 for selecting a modulation current for a VCSEL driver 210 based on a bit error rate analysis. In some embodiments, steps 810-895 of method 800 are performed in substantially the same manner as steps 710-795 of method 700.

Figure 9:
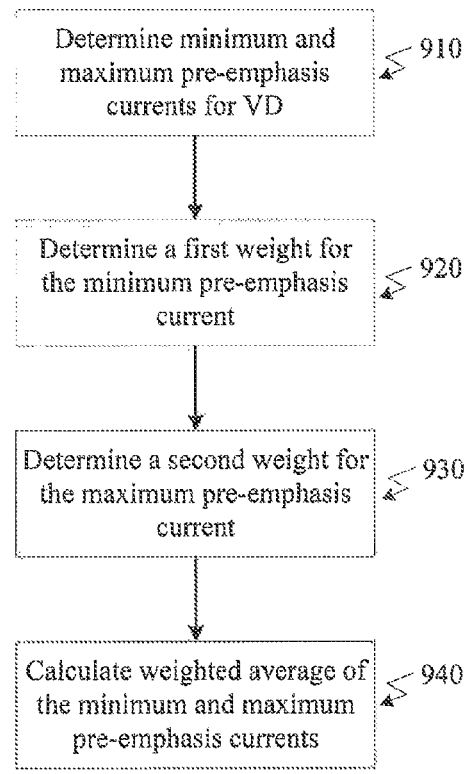
FIG. 9 illustrates an example method for selecting a pre-emphasis current for a VCSEL driver based on a bit error rate technique.

FIG. 9 is a diagram illustrating an example method 900 for selecting a pre-emphasis current for a VCSEL driver 210 based on a first pass point for a minimum pre emphasis current and a second pass point for a maximum pre-emphasis current. In some embodiments, method 900 begins with a determination of a first pass point for a minimum pre emphasis current and a second pass point for a maximum pre-emphasis current, determined, for example, as described above with respect to steps 710-790 of method 700 (step 910). A first weight may then be determined to apply to the first determined pass point (step 920) and a second weight may be determined to apply to the second determined pass point (step 930). In some embodiments, the first weight and the second weight are both set to be equal. For example, if jitter and bandwidth are equally important, the first weight and the second weight may he set to be equal. In other embodiments, the first weight and second weight are set as different values. For example, in embodiments in which a high bandwidth is more important than a low jitter, the second weight may be greater than the first weight. Alternatively, for example, in embodiments in which a low jitter is more important than a high bandwidth, the first weight may be greater than the second weight. After determining the first and second weight, a weighted average of the minimum and maximum pre-emphasis currents may be calculated (step 940). In some embodiments, the calculated weighted average may be set as the pre-emphasis current of the VCSEL driver 210. In other embodiments, the weighted average may be rounded to a certain nearest value and then set as the pre-emphasis current of the VCSEL driver 210. For example, the weighted average may be rounded to the nearest 0.4 mA (e.g., if the weighted average equals 2.1 mA, then the pre-emphasis current of the VCSEL driver 210 may be set to 2.0 mA, whereas if the weighted average equals 2.3 mA, then the pre-emphasis current of the VCSEL driver 210 may be set to 2.4 mA).

Several embodiments are described above with respect to a VCSEL driver and VCSEL installed in an active optical cable. As described above, active optical cables may provide a number of benefits over traditional electrical cables. However, a VCSEL driver and VCSEL for a laser module, rather than an active optical cable, may also be calibrated using the disclosed techniques. Moreover, a type of laser and laser driver other than a VCSEL and VCSEL driver may also be calibrated using the disclosed techniques.

Embodiments and all of the functional operations described in this specification can be implemented in digital electronic circuitry, or in computer software, firmware, or hardware, including the structures disclosed in this specification and their structural equivalents, or in combinations of them. Embodiments can be implemented as one or more computer program products, i.e., one or more modules of computer program instructions encoded on a computer readable medium, e.g., a machine readable storage device, a machine readable storage medium, a memory device, or a machine readable propagated signal, for execution by, or to control the operation of, data processing apparatus.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of them. A propagated signal is an artificially generated signal, e.g., a machine-generated electrical, optical, or electromagnetic signal, which is generated to encode information for transmission to suitable receiver apparatus.

A computer program (also referred to as a program, software, an application, a software application, a script, or code) can he written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to, a communication interface to receive data from or transfer data to, or both, one or more mass storage devices for storing data, e.g., magnetic, magneto optical disks, or optical disks.

Moreover, a computer can be embedded in another device. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVDROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client/server relationship to each other.

Certain features which, for clarity, are described in this specification in the context of separate embodiments, may also be provided in combination in a single embodiment. Conversely, various features which, for brevity, are described in the context of a single embodiment, may also be provided in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments have been described. Other embodiments are within the scope of the following claims.

What is claimed is:

1. A method for calibrating a laser driver, comprising:
determining first and second bit error rates for use in calibrating the laser driver;
selecting a first initial value associated with the first bit error rate based on an intended minimum bandwidth and selecting a second initial value associated with the second bit error rate based on an intended maximum jitter;
if the first bit error rate is above a predetermined bit error rate, increasing the first initial value until the first bit error rate is not above the predetermined bit error rate;

if the second bit error rate is above the predetermined bit error rate, decreasing the second initial value until the second bit error rate is not above the predetermined bit error rate; and setting a calibrated parameter for the laser driver based, at least in part, on the increased first initial value and the decreased second initial value.

2. The method of claim 1, wherein determining the first and second bit error rates further comprises:
inputting a first signal to the laser driver;
receiving a second signal, wherein the second signal is based, at least in part, on an output from the laser driver; and
comparing the first signal to the second signal.

3. The method of claim 2, further comprising:
inputting the output from the laser driver to a laser;
receiving light from the laser at a receiver; and
generating the second signal at the receiver.

4. The method of claim 3, wherein the laser is a vertical cavity surface-emitting laser.

5. The method of claim 3, wherein the light is received from the laser at the receiver via an optical fiber cable.

6. The method of claim 1, wherein the parameter is a pre-emphasis current associated with the laser driver.

7. The method of claim 1, wherein the parameter is a modulation current associated with the laser driver.

8. The method of claim 1, further comprising setting an average current output by the laser driver before setting the calibrated value for the parameter.

9. The method of claim 8, wherein the average current output is selected based, at least in part, on the intended lifetime for a laser driven by the laser driver.

10. A laser driver, wherein the laser driver is calibrated by performing the steps of:
determining first and second bit error rates for use in calibrating the laser driver;
selecting a first initial value for the first bit error rate based on an intended minimum bandwidth and selecting a second initial value for the second bit error rate based on an intended maximum jitter;
if the first bit error rate is above a predetermined bit error rate, increasing the first initial value until the first bit error rate is not above the predetermined bit error rate;
if the second bit error rate is above the predetermined bit error rate, decreasing the second initial value until the second bit error rate is not above the predetermined bit error rate; and
setting a calibrated parameter for the laser driver based, at least in part, on the increased first initial value and the decreased second initial value.

11. The laser driver of claim 10, wherein determining the first and second bit error rates further comprises:
inputting a first signal to the laser driver;
receiving a second signal, wherein the second signal is based, at least in part, on an output from the laser driver; and
comparing the first signal to the second signal.

12. The laser driver of claim 11, wherein the laser driver is further calibrated by performing the steps of:
inputting the output from the laser driver to the laser;
receiving light from the laser at a receiver; and
generating the second signal at the receiver.

13. The laser driver of claim 12, wherein the laser is a vertical cavity surface-emitting laser.

14. The laser driver of claim 10, wherein the parameter is a pre-emphasis current associated with the laser driver.

15. The laser driver of claim 10, wherein the parameter is a modulation current associated with the laser driver.

16. The laser driver of claim 10, wherein the laser driver is further calibrated by performing the step of setting an average current output by the laser driver before setting the calibrated value for the parameter.

17. The laser driver of claim 16, wherein the average current output is selected based, at least in part, on the intended lifetime for a laser driven by the laser driver.

18. The laser driver of claim 10, wherein the laser driver is installed in an active optical cable.

19. The laser driver of claim 10, wherein the laser driver is installed in a Quad Small Form factor Pluggable transceiver or an enhanced Quad Small Form-factor Pluggable transceiver.

20. The laser driver of claim 10, wherein the laser driver is installed in a Small Form factor Pluggable transceiver or an enhanced Small Form-factor Pluggable transceiver.

21. The laser driver of claim 10, wherein the laser driver is installed in an optical engine.

* * * * *